United States Patent
Maiti et al.

(10) Patent No.: US 8,264,896 B2
(45) Date of Patent: Sep. 11, 2012

(54) INTEGRATED CIRCUIT HAVING AN ARRAY SUPPLY VOLTAGE CONTROL CIRCUIT

(75) Inventors: Bikas Maiti, Austin, TX (US); Lawrence N. Herr, Coupland, TX (US); Rajesh R. Kini, Austin, TX (US); Tam M. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 787 days.

(21) Appl. No.: 12/183,767

(22) Filed: Jul. 31, 2008

(65) Prior Publication Data

US 2010/0027360 A1 Feb. 4, 2010

(51) Int. Cl.
*G11C 7/00* (2006.01)
*G11C 5/14* (2006.01)

(52) U.S. Cl. ............... 365/203; 365/189.011; 365/226; 365/189.16; 365/154

(58) Field of Classification Search ............. 365/189.16, 365/154, 203, 189.011, 226
See application file for complete search history.

(56) References Cited

U.S. PATENT DOCUMENTS

| | | | |
|---|---|---|---|
| 5,898,610 A | 4/1999 | Greason | |
| 6,791,864 B2 * | 9/2004 | Houston | 365/154 |
| 7,079,426 B2 | 7/2006 | Zhang et al. | |
| 7,088,607 B2 | 8/2006 | Matsuzawa et al. | |
| 7,292,485 B1 | 11/2007 | Lu et al. | |
| 7,292,495 B1 | 11/2007 | Kenkare et al. | |
| 2006/0262628 A1 * | 11/2006 | Nii et al. | 365/226 |
| 2007/0236983 A1 * | 10/2007 | Wang et al. | 365/154 |

* cited by examiner

*Primary Examiner* — Alexander Sofocleous
*Assistant Examiner* — Hai Pham
(74) *Attorney, Agent, or Firm* — Daniel D. Hill

(57) ABSTRACT

An integrated circuit comprises a plurality of memory cells and an array supply voltage control circuit. The plurality of memory cells are organized in rows and columns. A row comprises a word line and all of the memory cells coupled to the word line. A column comprises a bit line pair and all of the memory cells coupled to the bit line pair. The array supply voltage control circuit is coupled to the plurality of memory cells. The array supply voltage control circuit is for receiving a power supply voltage and for providing a reduced power supply voltage to memory cells of a selected column during a write operation in response to a voltage differential on the bit line pair of the selected column.

19 Claims, 2 Drawing Sheets

INTEGRATED CIRCUIT HAVING AN ARRAY SUPPLY VOLTAGE CONTROL CIRCUIT

BACKGROUND

1. Field

This disclosure relates generally to semiconductor circuits, and more specifically, to semiconductor circuits with low voltages.

2. Related Art

As technology improves, there is a desire to design integrated circuits, such as memory devices like static random access memories (SRAMs), that have at least the following three characteristics: 1) the smallest possible area (i.e., a small footprint); 2) good stability by having read static noise margins large enough to yield with statistical transistor variations; and 3) a write voltage margin large enough to yield with statistical transistor variation. It is difficult to design an integrated circuit that includes all three characteristics. For example, an integrated circuit can be designed that has good read stability by increasing the area but improving the read stability can cause the write voltage to degrade, which is undesirable. Thus, there is a need for an integrated circuit that has a small footprint, high read static noise margins, and is easy to write.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, precharged bit lines pairs are used to the memory voltage (VDD) for a predetermined bit cell during a write operation. In one embodiment, the integrated circuit includes a plurality of memory cells and an array supply control circuit. The memory cells are organized in rows and columns. A row includes a word line and all the memory cells that are coupled to the word line. A column includes a bit line pair and all the memory cells coupled to the bit line pair. The array supply voltage control circuit is coupled to the plurality of memory cells and receives a power supply voltage. The array supply voltage control circuit provides a reduced power supply voltage to the memory cells of the selected column during a write operation in response to a voltage differential on the bit line pair of the selected column.

Figure 1:
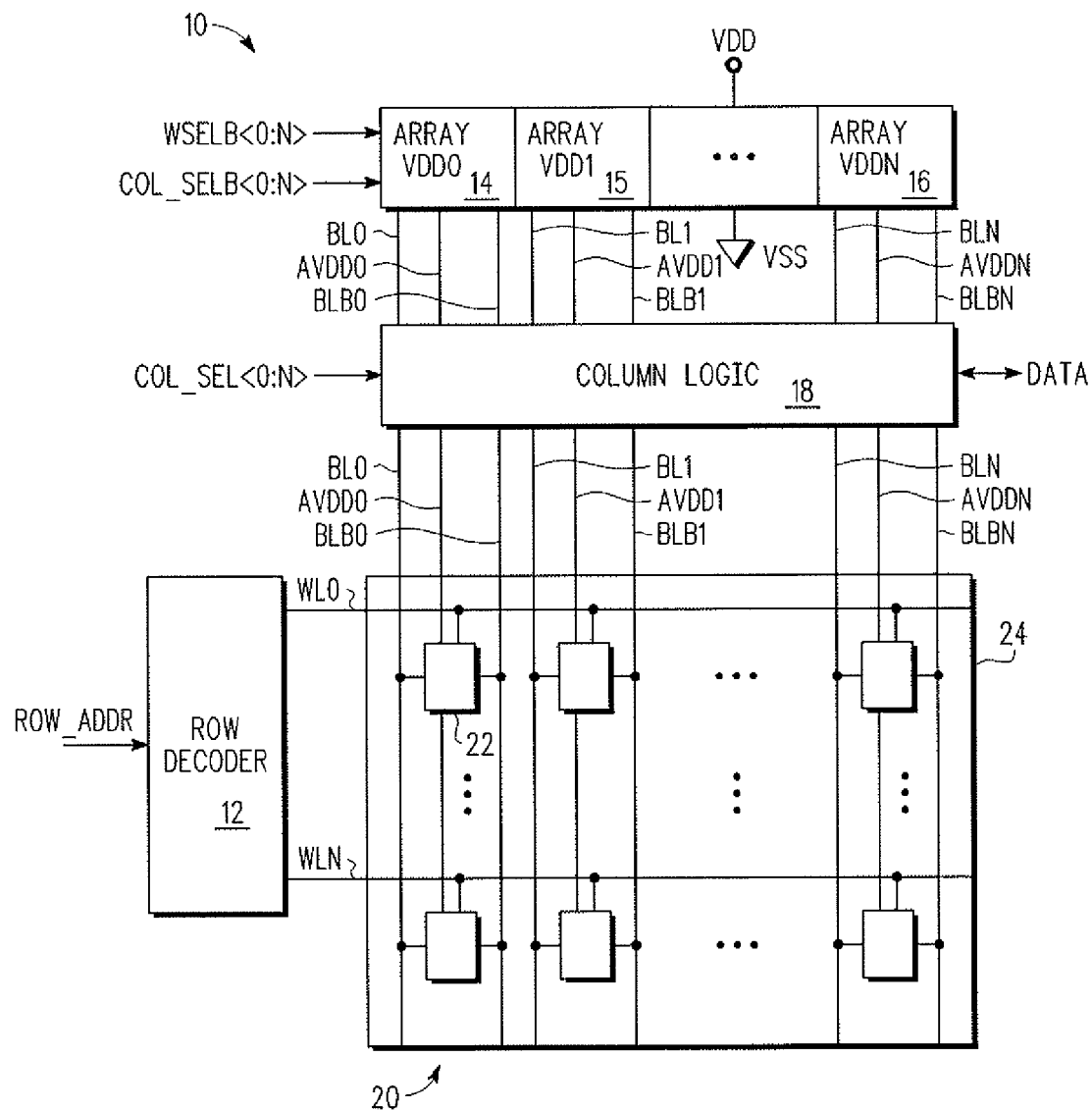
FIG. 1 illustrates a diagram of at least a portion of an integrated circuit in accordance with an embodiment.

FIG. 1 illustrates a diagram of at least a portion of an integrated circuit 10 in accordance with an embodiment. FIG. 1 includes a row decoder 12, array supply voltage control circuits 14-16, column logic 18, and a bit cell array 24, which may be a plurality of memory cells. In one embodiment, the row decoder 12 is coupled to the word lines (WL0, WLN) of the bit cell array 24. The row decoder may receive a row address (ROW_ADDR) signal from another portion of the integrated circuit or a different integrated circuit, such as a central processing unit (CPU). The bit cell array 24 includes bit cells, such as bit cell 22, which may be arranged in rows and columns, such as column 20. Each column of bit cells is coupled to bit lines, such as BL0-BLN and BLB0-BLBN. Each column has a bit line pair (BL0 and BLB0, BL1 and BLB1 . . . BLN and BLBN), which are two bit lines that are in the same column as each other. Each bit cell is coupled to word lines, such as WL0-WLN. The word lines (WL0-WLN) may receive signals, such as a row address signal ROW_ADDR from the row decoder 12. Each column of the bit cell array 24 also includes array VDD lines, which may also be referred to as power supply lines, such as AVDD0-AVDDN. The array VDD lines or power supply lines (which may be referred to as power supply terminals), AVDD0-AVDDN, can transmit the power supply voltage for a bit cell in columns 0-N, respectively, where column 0 is illustrated by the reference numeral 20. Each of the array VDD signals and the bit lines are coupled to the array supply voltage control circuits 14-16. Hence, for each column of the bit cell array 24 has dedicated bit lines, a dedicated array VDD line, and a dedicated array supply voltage control circuit. Hence, the number of bit lines, a dedication array VDD lines, and array supply voltage control circuits will depend on the number of columns present in the bit cell 22. More specifically, each column, such as column 20, of bit cells has its bit lines, such as BL0 and BLB0, and array VDD lines, such as AVDD0, that are coupled to only one of the array supply voltage control circuits, such as the array supply voltage control circuit 14. The array supply voltage control circuits 14-16 receive various signals, such as a power supply voltage VDD, a write select signal WSELB<0:N>, a column select signal COL_SELB<0:N> and outputs a signal, such as VSS, which may be ground. These signals can be received or sent to the CPU, for example. The column logic 18 also receives the column select signal COL_SEL<0:N> signal and provides data (DATA), receives data (DATA), or to, for example, the CPU.

During a write operation, the array VDD (AVDD0-AVDDN) corresponding to the bit cell that is being written, will be pulled down to a low voltage so that a write can easily be performed. To achieve this low voltage, a pair of bit lines (BL0-BLN and BLB0-BLBN) corresponding to the bit cell that is being written are pre-charged so that when a write signal is received by the array supply voltage control circuits 14-16, the array supply voltage control circuits 14-16 turns on. The combination of the pairs of bit lines that are pre-charged and the array supply voltage control circuits 14-16 that are on results in a reduced power supply voltage for the bit lines being written. This process and the circuitry that can be used in one embodiment to achieve this process, will be better understood after discussion of FIG. 2.

Figure 2:
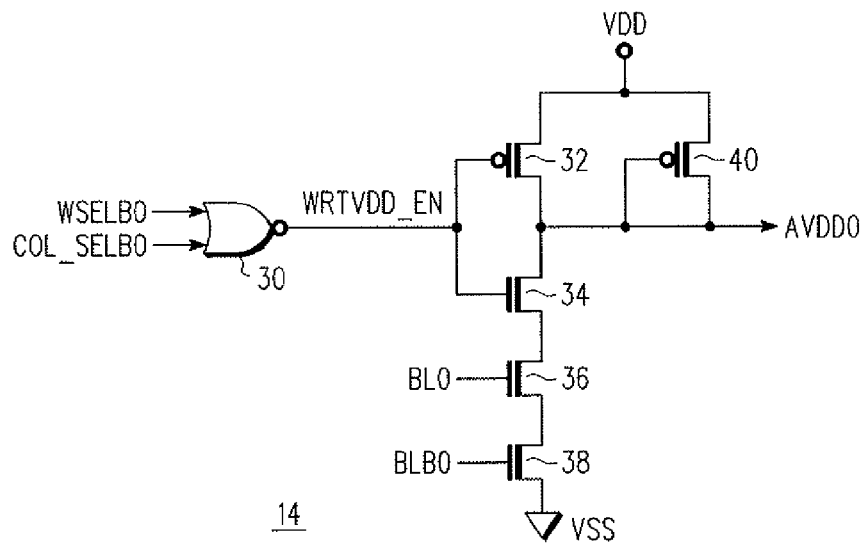
FIG. 2 illustrates at least a portion of an array supply voltage control circuit of the integrated circuit of FIG. 1 in accordance with an embodiment.

FIG. 2 illustrates a portion of an array supply voltage control circuit 14 of the integrated circuit 10 of FIG. 1 that is used to write the bit cell 22 in column 20 in accordance with an embodiment. In one embodiment, the bit cell 22 is a six transistor bit cell used for a memory device, such as an SRAM. However, the bit cell 22 may include any number of transistors. FIG. 2 includes a logic gate, such as an NOR gate, 30 that receives the write select signal WSELB0 and the column select signal COL_SELB0 from for example, a CPU. The signals combine to form an output, a write VDD enable signal WRTVDD_EN (that is sent to that gate of a PMOS transistor 32 and the gate of a NMOS transistor 34. The gates of the PMOS transistor 32 and the NMOS transistor 34 are coupled together. The drain of the PMOS transistor is coupled to VDD and the drain of the diode connect transistor 40, which as illustrated may be a PMOS transistor. The gate and diode of the diode connected transistor 40 may be coupled to the power supply line AVDD0. The drain of the PMOS transistor 32 is also coupled to the power supply line AVDD0. The drain of the PMOS transistor 32 is also coupled the drain of the NMOS transistor 34. The source of the NMOS transistor 34 is coupled to the drain of the NMOS transistor 36 that has a gate coupled to a bit line (BL0). The source of the NMOS transistor 36 is coupled to the drain of the NMOS transistor 38. The NMOS transistor 38 has its gate coupled to a bit line (BLB0) and its source coupled to VSS, which may be ground.

During a read cycle, the bit cell supply voltage is at the predetermined operating VDD voltage (VDDnominal) that is chosen so that there is no read disturb. Read disturb occurs when there is a failure to read the data from a bit cell during the read operation of the bit cell. At VDDnominal, the integrated circuit 10 has a predetermined signal to noise margin. During this read cycle, the write enable signal WRTVDD_EN is low and hence the array VDD (AVDD0-AVDDN) receive VDDnominal.

Before a write operation the BL0 and BLB are pre-charged by being set to high. When the write select signal WSELB0 and column select signal COL SELB0 or both are turned low, the write enable signal WRTVDD_EN will switch from low to high to trigger a write event for a bit cell in the column corresponding to the bit cell that is to be written, which in this example is bit cell 22. When the write enable signal WRTVD-D_EN is high, the power supply line AVDD0 is floated. Because the bit line pairs BL0 and BLB are already precharged, the power supply line AVDD0 will be lowered or reduced by voltage drop ΔVDD so that the bit cell can be easily written. The power supply line AVDD0 is not reduced below the retention voltage of the unselected bit cells so that the bits in the unselected bit cells do not flip in the selected column. The retention voltage is the minimum voltage needed to maintain a data state in the bit cell. The reduction of the power supply line AVDD0 is terminated by write data being sent along the bit line pairs BL0 and BLB0. During this write operation, one of the bit lines will go low and the supply voltage will be the VDDnominal minus ΔVDD. Hence, during the write operation the power supply AVDD0 of the bit cell 22 is pulled down during to a lower voltage. Because the voltage supply of the bit cell 22 is pulled down only for the bit cells in column 20, each bit cell voltage supply of each column can be independently controlled during the write cycle.

Figure 3:
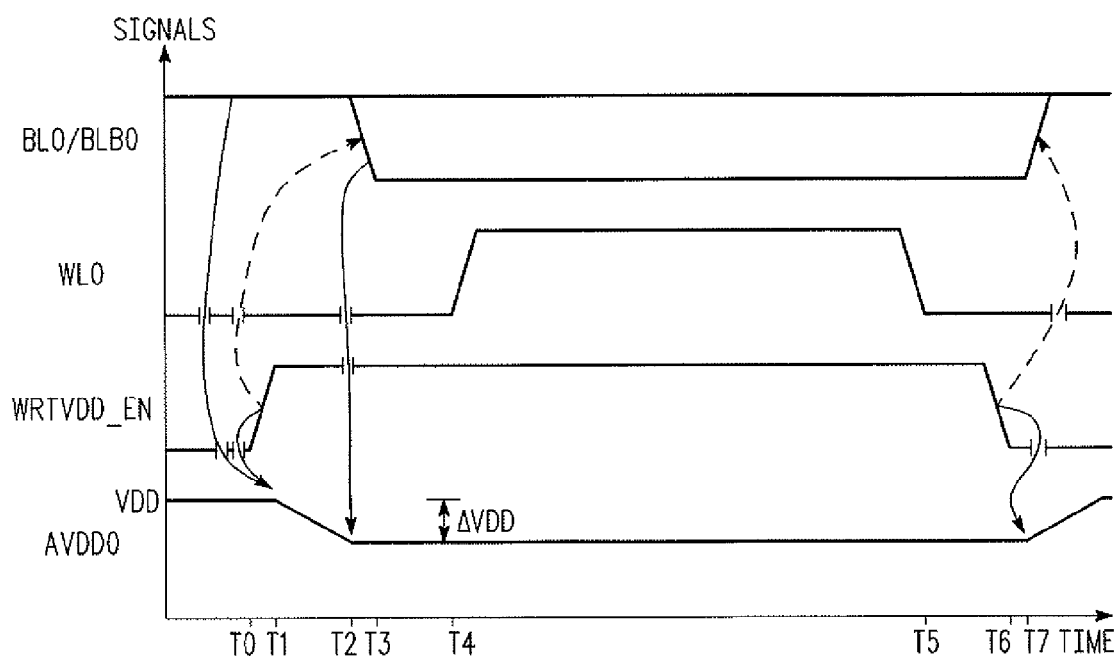
FIG. 3 illustrates a timing diagram of a write operation in accordance with an embodiment of the present invention.

FIG. 3 shows a timing diagram for a write operation of the bit cell 22 in accordance with one embodiment. The x-axis (or horizontal axis) of the timing diagram corresponds to time and the y-axis (or vertical axis) of the timing diagram corresponds to signals. The timing diagram illustrates various signals and their change in voltage over time during a write operation in accordance with one embodiment. The bit line pair BL0 and BLB0 both start off high, the word line WL0 starts off low, the write enable signal WRTVDD_EN starts out low and the power supply line AVDD0 starts off at VDD, which is VDDnominal. At time zero (T0), the write enable signal WRTVDD_EN is increased due to the write select signal WSELB0, the column select signal COL_SELB0, or both. When the write enable signal WRTVDD_EN reaches a trigger voltage, which may be a half voltage of the maximum voltage, at time one (T1), the power supply line AVDD0 will begin to decrease due to the bit line pairs BL0 and BLB0 being high and the write enable signal WRTVDD_EN reaching the trigger voltage as evidenced by the solid arrows pointing to the point on the power supply line AVDD0 at which the voltage decreases below VDD. In addition, soon after the write enable signal WRTVDD_EN is approximately equal its trigger voltage, one of the bit line pair BL0 or BLB0 will go low as evidenced by the dotted arrow suggesting that there is indirect causation. The time difference between the write enable signal WRTVDD_EN reaching its trigger voltage and one of the bit line pair BL0 or BLB0 decreasing will effect how quickly the power supply line AVDD0 decreases (i.e., the slope of the curve from T1 to T3). When a trigger voltage of one of the bit line pair BL0 or BLB0, whichever is decreasing, is reached, the power supply line AVDD0 will stop decreasing and will reach its minimum voltage, as illustrated at time three (T3). The difference between AVDD0 and its minimum voltage, as discussed above, is ΔVDD. This difference in voltage, ΔVDD, in one embodiment is 0.5 of VDD. In another embodiment, it is 0.4 of VDD. As discussed above, the voltage drop ΔVDD should not be so great that the minimum voltage is greater than the retention voltage of the bit cells, especially the unselected bit cells. Afterwards at time four (T4), the word line WL0 will increase to high for so that data can be written to the bit cell 22. T4 does not have to occur after T3 and can occur at any time after T1. After the data is written to the bit cell 22, the word line WL0 will return low at time five (T5). Afterwards, the write enable signal WRTVDD_EN will start returning to low at time six (T6). As a result the power supply line AVDD0 will begin to rise. This causation is illustrated by the solid arrow on the right-hand side of FIG. 3. Soon afterwards, one of the bit line pair BL0 or BLB0 that was low will begin to rise at time seven (T7) indirectly due to the power supply line AVDD0 rising, as illustrated by the dotted line on the right-hand side of FIG. 3.

In power down mode when it is desirable for the array content to be retained, it is desirable for the power supply lines AVDD0-AVDDN not to be floating, so signals such as the write select signals SELB<0:N> and the column select signals COL_SELB<0:N> should be held in a known state or the write enable signal WRTVDD_EN, and the write select signals WSELB<0:N> and the column select signals COL_SEL B<0:N> should be qualified during power down. In addition, timing of the write enable signal and the sizing of the pull down transistor 40 should be appropriate for the bit line height.

Some embodiments include the following:

1. An integrated circuit comprising: a plurality of memory cells organized in rows and columns, wherein a row comprises a word line and all of the memory cells coupled to the word line and a column comprises a bit line pair and all of the memory cells coupled to the bit line pair; and an array supply voltage control circuit coupled to the plurality of memory cells, the array supply voltage control circuit for receiving a power supply voltage and for providing a reduced power supply voltage to memory cells of a selected column during a write operation in response to a voltage differential on the bit line pair of the selected column. 2. The integrated circuit of item 1, wherein the array supply voltage control circuit comprises a plurality of array supply voltage control circuits, each of the plurality of array supply voltage control circuits coupled to a corresponding bit line pair of a plurality of bit line pairs. 3. The integrated circuit of item 2, further comprising a column logic circuit coupled to the bit line pairs between the plurality of memory cells and the plurality of array supply voltage control circuits. 4. The integrated circuit of item 1, wherein the array supply voltage control circuit comprises: a logic gate having a first input for receiving a write select signal, a second input for receiving a column select signal, and an output; a first transistor having a first current electrode coupled to receive the power supply voltage, a control electrode coupled to the output of the logic gate, and a second current electrode coupled to power supply terminals of each memory cell of the selected column of memory cells; a second transistor having a first current electrode coupled to the second current electrode of the first transistor, a control electrode coupled to the output of the logic gate, and a second current electrode; a third transistor having a first current electrode coupled to the second current electrode of the second transistor, a control electrode coupled to a first bit line of the bit line pair, and a second current electrode; a fourth transistor having a first current electrode coupled to the second current electrode of the third transistor, a control electrode coupled to a second bit line of the bit line pair, and a second current electrode coupled to ground; and a diode-connected transistor having a first current electrode coupled to receive the power supply voltage, and a control electrode and a second current electrode both coupled to the power supply terminals of each memory cell of the selected column of memory cells. 5. The integrated circuit of item 4, wherein the logic gate provides a NOR logic function. 6. The integrated circuit of item 4, wherein the first transistor is characterized as being a P-channel transistor and the second, third, and fourth transistors are characterized as being N-channel transistors. 7. The integrated circuit of item 1, wherein the reduced power supply voltage is a diode threshold voltage drop lower than the power supply voltage. 8. The integrated circuit of item 4, wherein the array supply voltage control circuit provides the power supply voltage to the power supply terminals of each memory cell in response to precharging the bit line pair. 9. The integrated circuit of item 1, wherein the plurality of memory cells comprises a plurality of static random access memory cells. 10. The integrated circuit of item 1, wherein a magnitude of the reduced power supply voltage is determined by a time period between selecting the selected column and providing a differential voltage to the bit line pair.

11. An integrated circuit comprising: a memory array comprising a plurality of memory cells, a plurality of word lines and a plurality of bit line pairs, wherein the memory array is organized in rows and columns, and wherein a row comprises a word line and all of the memory cells coupled to the word line and a column comprises a bit line pair and all of the memory cells coupled to the bit line pair; and a plurality of array supply voltage control circuits, wherein one array supply voltage control circuit is coupled to one bit line pair, and each of the plurality of array supply voltage control circuits for receiving a power supply voltage and for providing a reduced power supply voltage to memory cells of a selected column during a write operation in response to a voltage differential on the bit line pair of the selected column. 12. The integrated circuit of item 11, wherein each of the array supply voltage control circuits comprises: a first transistor having a first current electrode coupled to receive the power supply voltage, a control electrode coupled to receive a logic signal based on a select signal, and a second current electrode coupled to power supply terminals of each memory cell of the selected column of memory cells; a second transistor having a first current electrode coupled to the second current electrode of the first transistor, a control electrode coupled to the control electrode of the first transistor, and a second current electrode; a third transistor having a first current electrode coupled to the second current electrode of the second transistor, a control electrode coupled to a first bit line of the bit line pair, and a second current electrode; and a fourth transistor having a first current electrode coupled to the second current electrode of the third transistor, a control electrode coupled to a second bit line of the bit line pair, and a second current electrode coupled to ground. 13. The integrated circuit of item 12, further comprising a diode-connected transistor having a first current electrode coupled to receive the power supply voltage, and a control electrode and a second current electrode both coupled to the power supply terminals of each memory cell of the selected column of memory cells. 14. The integrated circuit of item 13, further comprising a logic gate having a first input for receiving a write select signal, a second input for receiving a column select signal, and an output coupled to the control electrodes of the first and second transistors. 15. The integrated circuit of item 11, wherein the reduced power supply voltage is limited to a diode threshold voltage drop lower than the power supply voltage. 16. The integrated circuit of item 11, wherein the array supply voltage control circuit provides the power supply voltage to the power supply terminals of each memory cell in response to precharging the bit line pair. 17. The integrated circuit of item 11, wherein a magnitude of the reduced power supply voltage is determined by a time period between selecting the selected column and providing a differential voltage to the bit line pair.

18. An integrated circuit comprising: a memory array comprising a plurality of memory cells, a plurality of word lines and a plurality of bit line pairs, wherein the memory array is organized in rows and columns, and wherein a row comprises a word line and all of the memory cells coupled to the word line and a column comprises a bit line pair and all of the memory cells coupled to the bit line pair; and a plurality of array supply voltage control circuits, each of the plurality of array supply voltage control circuits comprising: a first transistor having a first current electrode coupled to receive the power supply voltage terminal, a control electrode coupled to receive a logic signal based on a select signal, and a second current electrode coupled to power supply terminals of each memory cell of the selected column of memory cells; a second transistor having a first current electrode coupled to the second current electrode of the first transistor, a control electrode coupled to the control electrode of the first transistor, and a second current electrode; a third transistor having a first current electrode coupled to the second current electrode of the second transistor, a control electrode coupled to a first bit line of the bit line pair, and a second current electrode; and a fourth transistor having a first current electrode coupled to the second current electrode of the third transistor, a control electrode coupled to a second bit line of the bit line pair, and a second current electrode coupled to ground. 19. The integrated circuit of item 18, wherein the array supply voltage control circuit provides the power supply voltage to the power supply terminals of each memory cell in response to precharging the bit line pair. 20. The integrated circuit of item 18, wherein a magnitude of the reduced power supply voltage is determined by a time period between selecting the selected column and providing a differential voltage to the bit line pair.

By now it should be appreciated that there has been provided an integrated circuit having bit line pairs that are used to lower VDDnominal for a predetermined bit cell during a write operation. Precharged bit lines are used to decrease the VDDnominal instead of using coupling or pulse solutions. The arrival of the write data terminates the decrease in the VDDnominal. Hence, write data arrival time is used to limit this voltage reduction. The integrated circuit can be part of a column data path and may be implemented on a column pitch basis. If this integrated circuit is decreased in size data retention voltage on the column that being written will not be affect and will not cause read disturb on the unselected bit cells that are coupled to the same word line as the selected bit cell. The described integrated circuit can be designed having a small area (i.e., a small footprint); good stability by having read static noise margins large enough to yield with statistical transistor variations; and a write voltage margin large enough to yield with statistical transistor variation.

Each signal described herein may be designed as positive or negative logic, where negative logic can be indicated by the letter "B" at the end of the name. Hence, any signal name that has a "B" at the end of the name is the logical complement of a signal having the same name without the "B" at the end of the name. For example, COL_SELB<0:N> is the logical complement of COL_SEL<0:N>. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Carrots are used herein to indicate the conductors of a bus or the bit locations of a value. For example, "ADDRESS <3:0>" would indicate the four lower order bits of an address value.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a plurality of memory cells organized in rows and columns, wherein a row comprises a word line and all of the memory cells coupled to the word line and a column comprises a bit line pair and all of the memory cells coupled to the bit line pair;
an array supply voltage control circuit coupled to the plurality of memory cells, the array supply voltage control circuit for receiving a power supply voltage and for providing a reduced power supply voltage to memory cells of a selected column during a write operation in response to a voltage differential on the bit line pair of the selected column, wherein the array supply voltage control circuit comprises:
a logic gate having a first input for receiving a write select signal, a second input for receiving a column select signal, and an output;
a first transistor having a first current electrode coupled to receive the power supply voltage, a control electrode coupled to the output of the logic gate, and a second current electrode coupled to power supply terminals of each memory cell of the selected column of memory cells;
a second transistor having a first current electrode coupled to the second current electrode of the first transistor, a control electrode coupled to the output of the logic gate, and a second current electrode;
a third transistor having a first current electrode coupled to the second current electrode of the second transistor, a control electrode coupled to a first bit line of the bit line pair, and a second current electrode; and
a fourth transistor having a first current electrode coupled to the second current electrode of the third transistor, a control electrode coupled to a second bit line of the bit line pair, and a second current electrode coupled to ground.

2. The integrated circuit of claim 1, wherein the array supply voltage control circuit comprises a plurality of array supply voltage control circuits, each of the plurality of array supply voltage control circuits coupled to a corresponding bit line pair of a plurality of bit line pairs.

3. The integrated circuit of claim 2, further comprising a column logic circuit coupled to the bit line pairs between the plurality of memory cells and the plurality of array supply voltage control circuits.

4. The integrated circuit of claim 1, wherein the array supply voltage control circuit further comprises:
a diode-connected transistor having a first current electrode coupled to receive the power supply voltage, and a control electrode and a second current electrode both coupled to the power supply terminals of each memory cell of the selected column of memory cells.

5. The integrated circuit of claim 1, wherein the logic gate provides a NOR logic function.

6. The integrated circuit of claim 1, wherein the first transistor is characterized as being a P-channel transistor and the second, third, and fourth transistors are characterized as being N-channel transistors.

7. The integrated circuit of claim 1, wherein the reduced power supply voltage is a diode threshold voltage drop lower than the power supply voltage.

8. The integrated circuit of claim 1, wherein the array supply voltage control circuit provides the power supply voltage to the power supply terminals of each memory cell in response to precharging the bit line pair.

9. The integrated circuit of claim 1, wherein the plurality of memory cells comprises a plurality of static random access memory cells.

10. The integrated circuit of claim 1, wherein a magnitude of the reduced power supply voltage is determined by a time period between selecting the selected column and providing a differential voltage to the bit line pair.

11. An integrated circuit comprising:
- a memory array comprising a plurality of memory cells, a plurality of word lines and a plurality of bit line pairs, wherein the memory array is organized in rows and columns, and wherein a row comprises a word line and all of the memory cells coupled to the word line and a column comprises a bit line pair and all of the memory cells coupled to the bit line pair;
- a plurality of array supply voltage control circuits, wherein one array supply voltage control circuit is coupled to one bit line pair, and each of the plurality of array supply voltage control circuits for receiving a power supply voltage and for providing a reduced power supply voltage to memory cells of a selected column during a write operation in response to a voltage differential on the bit line pair of the selected column, wherein each of the plurality of array supply voltage control circuits comprises:
  - a first transistor having a first current electrode coupled to receive the power supply voltage, a control electrode coupled to receive a logic signal based on a select signal, and a second current electrode coupled to power supply terminals of each memory cell of the selected column of memory cells;
  - a second transistor having a first current electrode coupled to the second current electrode of the first transistor, a control electrode coupled to the control electrode of the first transistor, and a second current electrode;
  - a third transistor having a first current electrode coupled to the second current electrode of the second transistor, a control electrode coupled to a first bit line of the bit line pair, and a second current electrode; and
  - a fourth transistor having a first current electrode coupled to the second current electrode of the third transistor, a control electrode coupled to a second bit line of the bit line pair, and a second current electrode coupled to ground.

12. The integrated circuit of claim 11, further comprising a diode-connected transistor having a first current electrode coupled to receive the power supply voltage, and a control electrode and a second current electrode both coupled to the power supply terminals of each memory cell of the selected column of memory cells.

13. The integrated circuit of claim 12, further comprising a logic gate having a first input for receiving a write select signal, a second input for receiving a column select signal, and an output coupled to the control electrodes of the first and second transistors.

14. The integrated circuit of claim 11, wherein the reduced power supply voltage is limited to a diode threshold voltage drop lower than the power supply voltage.

15. The integrated circuit of claim 11, wherein the array supply voltage control circuit provides the power supply voltage to the power supply terminals of each memory cell in response to precharging the bit line pair.

16. The integrated circuit of claim 11, wherein a magnitude of the reduced power supply voltage is determined by a time period between selecting the selected column and providing a differential voltage to the bit line pair.

17. An integrated circuit comprising:
- a memory array comprising a plurality of memory cells, a plurality of word lines and a plurality of bit line pairs, wherein the memory array is organized in rows and columns, and wherein a row comprises a word line and all of the memory cells coupled to the word line and a column comprises a bit line pair and all of the memory cells coupled to the bit line pair; and
- a plurality of array supply voltage control circuits, each of the plurality of array supply voltage control circuits comprising:
  - a first transistor having a first current electrode coupled to receive the power supply voltage terminal, a control electrode coupled to receive a logic signal based on a select signal, and a second current electrode coupled to power supply terminals of each memory cell of the selected column of memory cells;
  - a second transistor having a first current electrode coupled to the second current electrode of the first transistor, a control electrode coupled to the control electrode of the first transistor, and a second current electrode;
  - a third transistor having a first current electrode coupled to the second current electrode of the second transistor, a control electrode coupled to a first bit line of the bit line pair, and a second current electrode; and
  - a fourth transistor having a first current electrode coupled to the second current electrode of the third transistor, a control electrode coupled to a second bit line of the bit line pair, and a second current electrode coupled to ground.

18. The integrated circuit of claim 17, wherein the array supply voltage control circuit provides the power supply voltage to the power supply terminals of each memory cell in response to precharging the bit line pair.

19. The integrated circuit of claim 17, wherein a magnitude of the reduced power supply voltage is determined by a time period between selecting the selected column and providing a differential voltage to the bit line pair.

* * * * *